(12) United States Patent
Yamada et al.

(10) Patent No.: US 6,647,543 B2
(45) Date of Patent: Nov. 11, 2003

(54) METHOD FOR MANUFACTURING A PAIR OF COMPLEMENTARY MASKS

(75) Inventors: Yasuhisa Yamada, Tokyo (JP); Kenichi Takada, Kanagawa (JP)

(73) Assignee: NEC Corporation, Tokyo (JP)

( * ) Notice: Subject to any disclaimer, the term of this patent is extended or adjusted under 35 U.S.C. 154(b) by 64 days.

(21) Appl. No.: 10/083,103

(22) Filed: Feb. 27, 2002

(65) Prior Publication Data

US 2002/0170031 A1 Nov. 14, 2002

(30) Foreign Application Priority Data

Feb. 28, 2001 (JP) ..................... 2001-053885

(51) Int. Cl.[7] ................. G06F 17/50; G06F 19/00; G03F 9/00; G06K 9/03
(52) U.S. Cl. ................. 716/21; 700/96; 700/105; 700/110; 700/120; 700/121; 430/5; 378/35; 382/144
(58) Field of Search ................. 716/21; 700/96, 700/105, 110, 120, 121; 430/5; 378/35; 382/144

(56) References Cited

U.S. PATENT DOCUMENTS

| 4,547,895 | A | * | 10/1985 | Mita et al. ............ 382/144 |
| 4,870,693 | A | * | 9/1989 | Arai et al. ............ 382/144 |
| 5,424,154 | A | * | 6/1995 | Borodovsky .......... 430/5 |
| 5,432,044 | A | * | 7/1995 | Shimizu ............... 430/269 |
| 5,597,668 | A | * | 1/1997 | Nowak et al. ......... 430/5 |
| 5,663,893 | A | * | 9/1997 | Wampler et al. ...... 716/19 |
| 5,681,674 | A | * | 10/1997 | Fujimoto ............. 430/5 |
| 5,763,955 | A | * | 6/1998 | Findley et al. ....... 257/775 |
| 5,795,685 | A | * | 8/1998 | Liebmann et al. ..... 430/5 |
| 6,340,543 | B1 | * | 1/2002 | Nagamura et al. ..... 430/5 |
| 6,541,165 | B1 | * | 4/2003 | Pierrat .............. 430/5 |
| 2001/0012390 | A1 | * | 8/2001 | Watanabe ............ 382/144 |
| 2002/0031725 | A1 | * | 3/2002 | Sugita et al. ........ 430/311 |
| 2003/0022071 | A1 | * | 1/2003 | Sugita et al. ........ 430/5 |

FOREIGN PATENT DOCUMENTS

JP 11-354422 A 12/1999

OTHER PUBLICATIONS

Schellenberg et al., "Adoption of OPC and the impact on design and layout", Proceedings of 2001 Design Automation Conference, Jun. 18, 2001, pp. 89–92.*

* cited by examiner

Primary Examiner—Matthew Smith
Assistant Examiner—Phallaka Kik
(74) Attorney, Agent, or Firm—Sughrue Mion, PLLC

(57) ABSTRACT

A method for manufacturing a pair of complementary masks for use in an electron projection lithographic (EPL) technique uses an algorithm for distributing the design data to a pair of EPL masks. The algorithm allocates a positive sign or negative sign to each of the pattern data, summation of the areas of the pattern data having positive signs while subtracting the areas of the pattern data having negative signs, for obtaining a minimum of the sum. One or more of initial combination of the signs is prepared and the vicinity of the initial combination is calculated therefrom for obtaining an optimum combination.

6 Claims, 8 Drawing Sheets

METHOD FOR MANUFACTURING A PAIR OF COMPLEMENTARY MASKS

BACKGROUND OF THE INVENTION (a) Field of the Invention

The present invention relates to a method for manufacturing a pair of complementary masks and, more particularly, to an improvement of the method for manufacturing a pair of complementary masks for use in an electron beam (EB) lithography.

(b) Description of the Related Art

Along with the development in higher integration of semiconductor devices, lithographic techniques are ever directed to finer design-rule patterning. In this situation, X-ray and EB lithographic techniques attract larger attentions instead of the conventional lithographic technique using ultraviolet-ray having a longer wavelength.

In the EB lithography, an objective device pattern is formed by iterative operation of deflecting an electron beam to form a pattern on a specified area, and then moving the wafer stage to effect forming a pattern on a different area of the wafer. The deflection of the electron beam is conducted based on the writing data obtained beforehand by conversion of the design data of the semiconductor device.

In a new-developed EB technique called cell projection type patterning, iterative patterns having an area of a several-micrometers square is formed on a mask after extraction of the data from a device pattern, followed by projection of the iterative patterns on the semiconductor device at a time, thereby realizing depiction of a plurality of patterns on a specified area of the wafer at a higher rate.

The EB technique including the new-developed cell projection type patterning, however, has yet an insufficient throughput due to the consecutive depiction of the patterns, irrespective whether these patterns are formed by a single pattern basis or a single area basis.

In the circumstances as described above, a new electron projection lithographic (EPL) technique is developed for solving the above problem while taking advantage of the EB lithographic technique having a higher resolution.

The new-developed EPL technique is such that a projection pattern is formed on a mask while magnifying the device pattern at a specified ratio, as in the case of the conventional photolithographic technique, to obtain an EPL mask. The EPL mask is different from the photolithographic mask in that the EPL mask passes the electron beam therethrough, which necessitates use of a stencil mask wherein pattern openings are formed in a silicon substrate, or a membrane mask wherein a plurality of shield stripes made of a metal are formed on a SiC or SiN thin film, instead of the quartz mask. In the EPL technique, the mask is separated into a plurality of one-shot areas each called "sub-field", within which an EPL system can project a pattern with a single shot of electron beams.

Figure 1A:
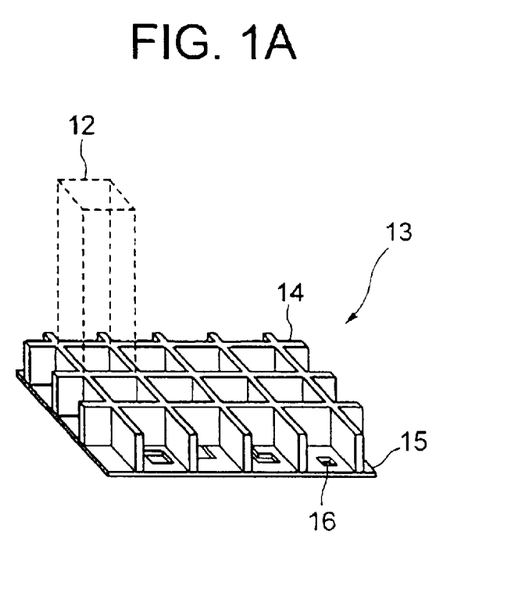
FIG. 1A is a perspective view of an EPL mask.
Figure 1B:
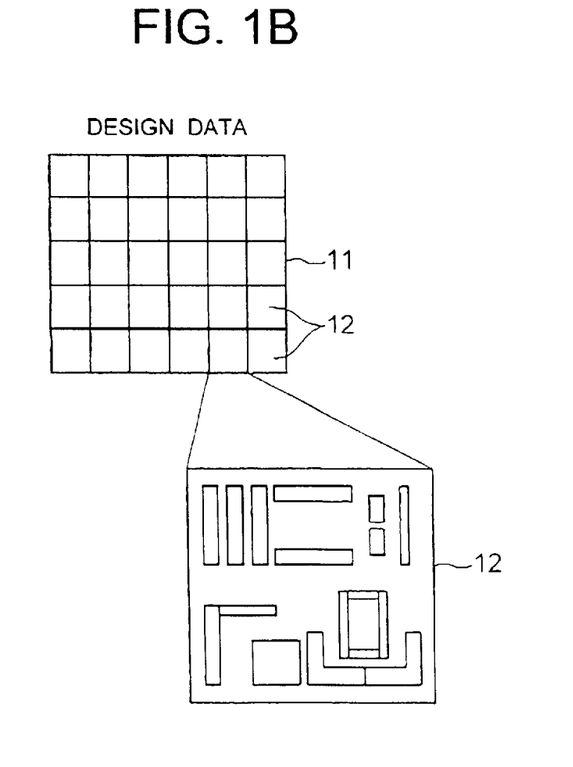
FIG. 1B is a schematic view of a design data including detail of the sub-field data, FIGS. 2A and 2B schematic top plan views of pattern data, showing different types of data conversion while illustrating flows of data processing.

FIG. 1A shows an example of the stencil mask, generally designated by numeral 13, including a plurality of sub-fields 12. The stencil mask 13 includes a support grid 14 having a plurality of cell openings each receiving therein a sub-field 12, and a silicon substrate 15 adhered onto the support grid 14 and including a plurality of stencil openings 16 received in each of the cell openings of the support grid 14. Referring to FIG. 1B, the sub-field 12 of the EPL mask 13 is extracted from the EPL pattern 11 of the design data.

In general, in the case of the EPL mask implemented by a stencil mask, it is difficult to form a particular pattern opening in the silicon substrate if the particular pattern opening involves a lower mechanical strength of the mask. The lower mechanical strength arises in the case of, for example, an endless pattern such as a donut pattern or a plurality of stripe patterns juxtaposed. For realizing such a specific pattern opening causing a lower mechanical strength, the EPL mask has a particular structure such as having a reinforcement therein.

The particular pattern is generally formed on a pair of complementary masks each mounting thereon one of a pair of patterns obtained by dividing the original particular pattern and capable of being formed as a stencil opening without degrading the mechanical strength.

Figure 2A:
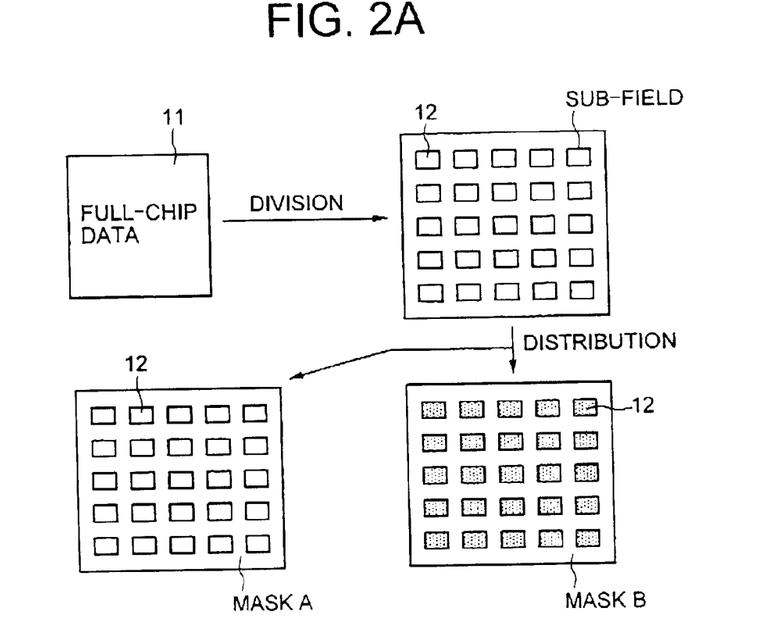
Figure 2B:
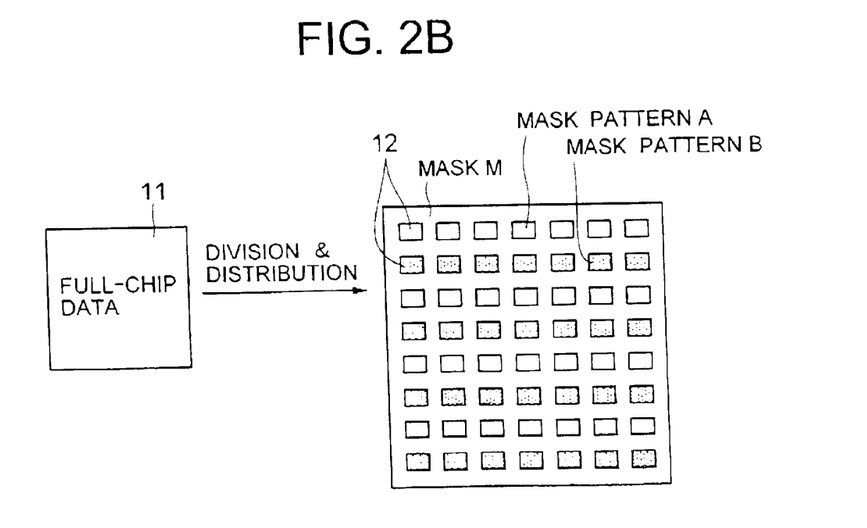

Examples of the complementary mask patterns includes a first type such as shown in FIG. 2A wherein a full-chip data is divided into a plurality of sub-field data 12, which are formed on a pair of complementary masks A and B, and a second type such as shown in FIG. 2B wherein a full-chip data is divided into a plurality of sub-field data 12, which are formed on a single mask M mounting thereon mask pattern data A and B. That is, the pair of complementary mask patterns A and B may be formed on a pair of masks or a single mask depending on the type. In this text, the mask or masks mounting thereon a pair of complementary mask patterns A and B may be referred to as a pair of complementary masks A and B irrespective whether the mask patterns A and B are formed on a pair of complementary masks A and B or a single mask M.

Figure 3:
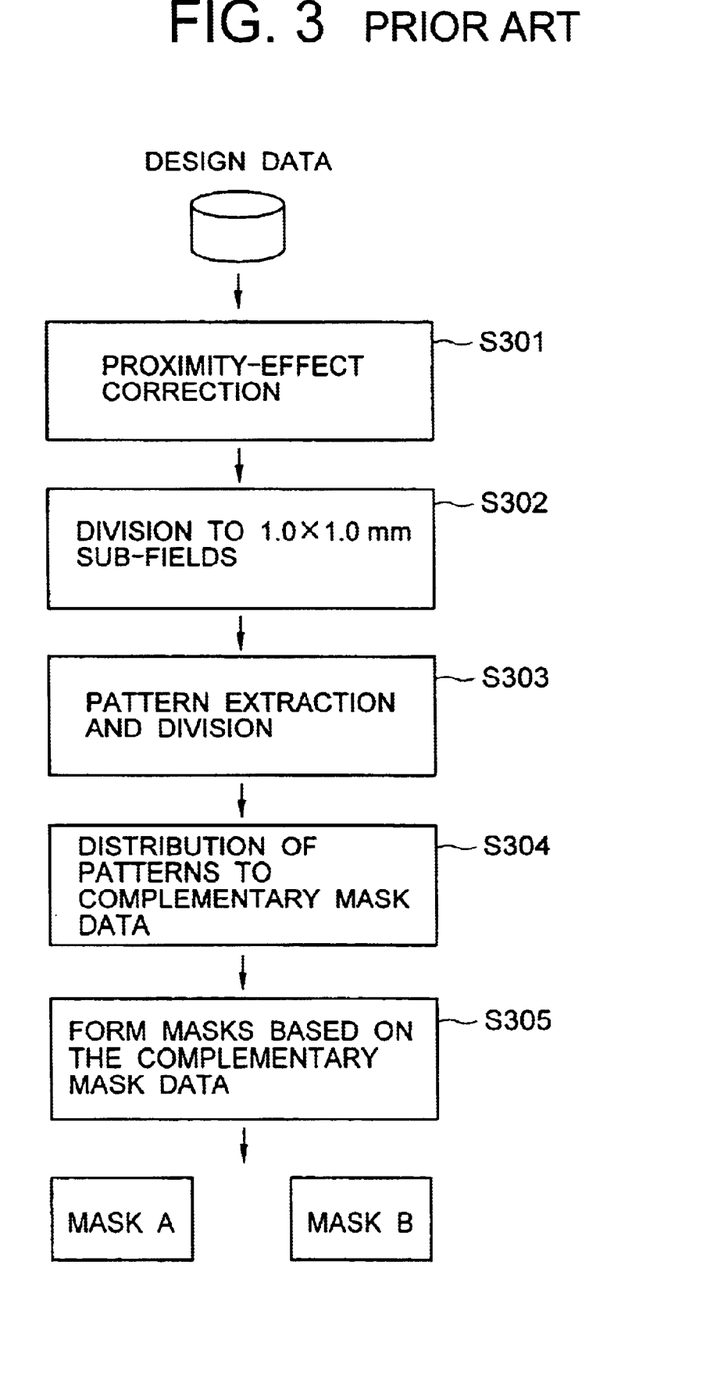
FIG. 3 is a flowchart of a typical conventional process for manufacturing complementary EPL masks from design data.

Referring to FIG. 3 showing a typical process for forming a pair of complementary masks A and B, the typical process includes a first step S301, wherein the full-chip data obtained from the design data is subjected to a proximity effect correction to resize or reshape the pattern, a second step S302, wherein the corrected data is divided into a plurality of sub-field data each having a 1.0 mm×1.0 mm square size, a third step S303, wherein each sub-field data is subjected to pattern extraction for extracting one or more particular pattern data, such as donut data, and dividing the extracted particular pattern data into a plurality of rectangular pattern data, a fourth step S304, wherein the rectangular pattern data are distributed to a pair of complementary masks A and B to output mask data, and a fifth step S305, wherein a pair of EPL complementary masks A and B are formed based on the mask data.

In the conventional process as described above, if the sub-field data are distributed to the pair of complementary masks A and B while noticing only the particular pattern data such as donut pattern data, an inequality of the opening area or the pattern density of the stencil mask may arise between the mask A and the mask B. In general, the EB lithography using a pair of masks having different opening areas or different pattern densities causes different spatial charge effects or different resist heating for the masks A and B, generating variances in the focal depth and the amount of heat reserve between the masks A and B. This results in variances in the dimensions, degradation in the accuracy and thus defects of the resultant patterns on the semiconductor devices. The difference in the pattern density between the complementary masks A and B also degrades the accuracy of the mask processing, especially in the etching for the stencil openings in the silicon substrate, thereby generating variances in the mask dimensions.

It is attempted in the prior art to solve the above problem caused by the difference in the pattern density between the EPL masks. Patent Publication JP-A-1999-354422 describes an example of such an attempt, wherein some patterns among a plurality of patterns located in a higher pattern-density mask and each having a size larger than a specified size are extracted, and each of the extracted patterns is provided with a non-exposure pattern having a size smaller than a critical resolution of an optical system. In other words, by removing a part of the pattern in a small amount, which does not directly affect the exposed pattern, the difference in the pattern density between the masks is alleviated.

The technique described in the above publication, however, uses a complicated technique such as reshaping of the patterns, and also involves a restriction on the size of the non-exposure pattern and thus an limited equality to be obtained. Thus, the problem in the conventional technique is not effectively solved by the publication.

Figure 4A:
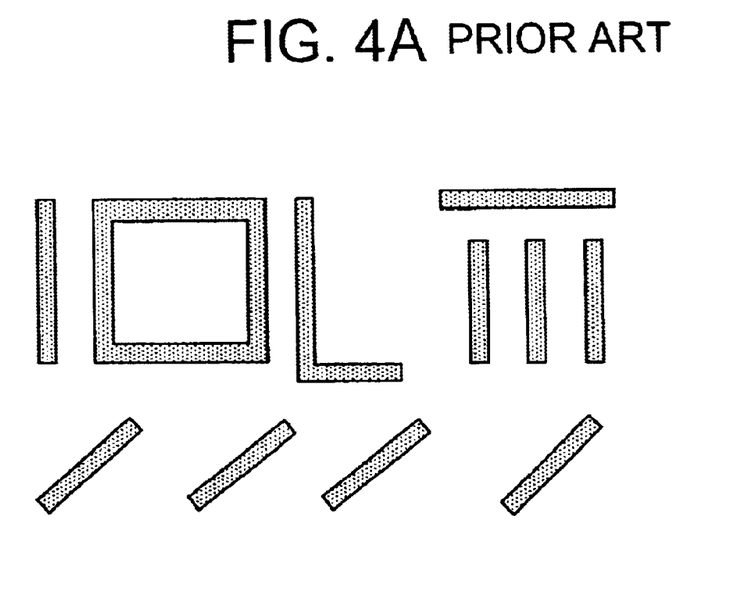
FIGS. 4A and 4B are schematic views of pattern data, illustrating data processing for manufacturing a checkered pattern mask including mask data A and B.
Figure 4B:
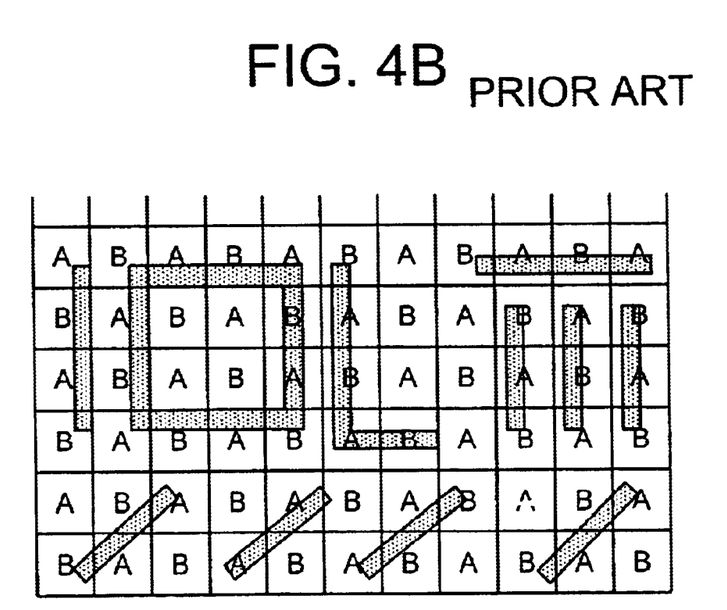

Another technique attempted is such that the design data is divided into a plurality of mesh patterns each having a specific size, such as shown in FIG. 4A, which are then distributed to the mask patterns A and B so that the mask patterns A and B form a checkered pattern on a single mask, as shown in FIG. 4B.

The another technique shown in FIGS. 4A and 4B divides the design data and distributes the meshed patterns without noticing the shape of the pattern. This does not necessarily render the pattern densities of the masks A and B to be equal, depending on the pattern shape and the distribution thereof, whereby accurate EPL masks cannot be necessarily obtained.

SUMMARY OF THE INVENTION

It is an object of the present invention to provide a method for manufacturing a pair of complementary EPL masks having a substantial equality in the pattern density between the EPL masks.

The present invention also provides a method for manufacturing a pair of complementary masks including the steps of extracting a plurality of pattern data from design data, distributing the pattern data to a pair of complementary mask data, and forming a pair of complementary masks based on the complementary mask data.

The distributing step includes the steps of: allocating either a first or a second sign to each of the pattern data to obtain an initial combination of signs; changing the sign of one or more element of initial combination to obtain a next combination, and calculating a sum data for the next combination by adding areas of the pattern data each having the first sign in the next combination while subtracting areas of the pattern data each having the second sign in the next combination; iterating the changing of the sign and the calculating of a sum data for the next combination, to obtain an optimum combination of the first and second signs providing a minimum of the sum data; and assigning the pattern data having first signs to one of the complementary mask data, and the pattern having the second signs to the other of the complementary mask data.

The EPL masks manufactured by the method of the present invention provides a substantial equality in the pattern density between the complementary masks and thus achieves an equal spatial charge effect as well as an equal resist heating effect during the EPL process using the EPL masks. This suppresses variances in the focal depth, spatial charge effect and the resist heating effect between the complementary masks. In addition, the substantial equality in the pattern density between the complementary masks achieves an accurate etching for the stencil patterning of the mask processing, especially on a silicon substrate, thereby suppressing the variances in the mask dimensions. Moreover, the time length for manufacturing the mask data which realizes a higher accuracy EPL mask can be reduced.

PREFERRED EMBODIMENTS OF THE INVENTION

Now, the present invention is more specifically described with reference to accompanying drawings.

Figure 5:
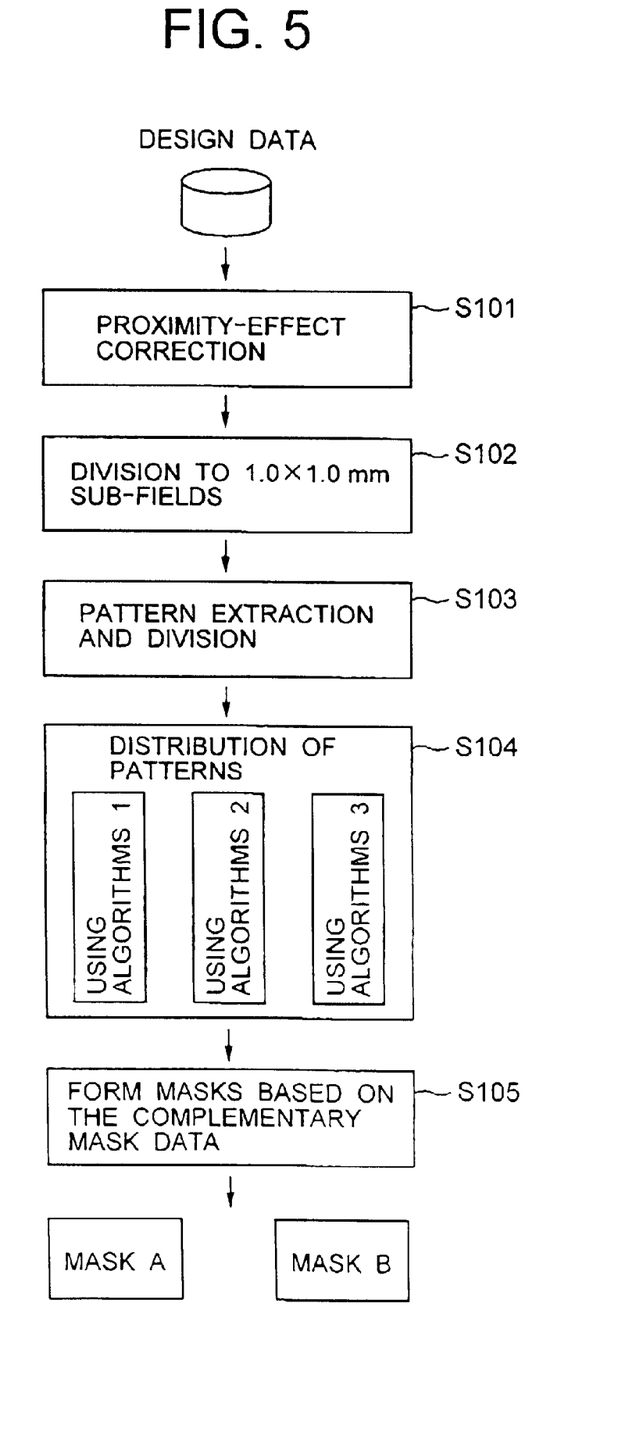
FIG. 5 is a flowchart of data processing for manufacturing complementary EPL masks, according to an embodiment of the present invention.

Referring to FIG. 5, a process for manufacturing a pair of complementary EPL masks according to an embodiment of the present invention includes a first (proximity effect correction) step S101, wherein the full-chip data of a semiconductor device obtained from the design data is subjected to a proximity effect correction to resize or reshape the patterns, a second (sub-field division) step S102, wherein the corrected data is divided into a plurality of sub-field data each having, for example, a 1.0 mm×1.0 mm square size, a third (pattern division) step S103, wherein each sub-field data is subjected to pattern extraction for extracting a particular pattern data, such as donut pattern data, and dividing the extracted pattern data into a plurality of rectangular pattern data, a fourth (pattern distribution) step S104, wherein the pattern data are distributed to a pair of complementary mask data by using first to three algorithms so that the pattern density or opening area ratio is substantially uniform between the complementary masks, and a fifth (mask formation) step S305, wherein a pair of EPL complementary masks A and B having a substantially equal pattern density are formed based on the complementary mask data. The steps S101 to S103 and S105 are similar to those described with reference to the conventional technique, and the detail description thereof is omitted herein for avoiding a duplication.

Figure 6:
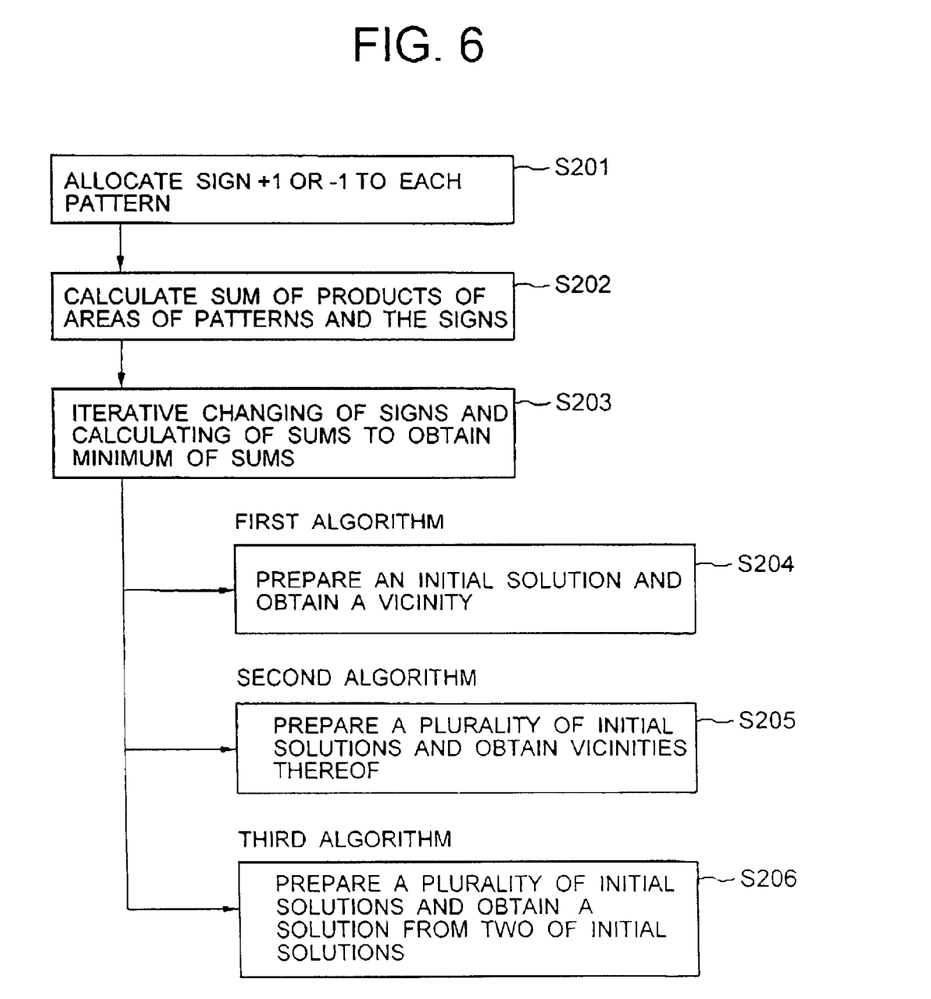
FIG. 6 is a flowchart of data processing for distribution of sub-field data to a pair of complementary masks A and B.

The distribution of the pattern data in step S104 is conducted based on specific algorithms. Referring to FIG. 6, the process using the specific algorithms in step S104 includes a first step S201, wherein a sign +1 or −1 is allocated to each rectangular pattern data obtained in the pattern division step S103 in FIG. 4. The sign +1 or −1 finally allocated to each rectangular pattern data specifies destination of the each rectangular pattern data, i.e. either the mask A or the mask B, during the distribution.

Subsequently, the process advances to a second step S202, wherein a product of the area of each rectangular pattern and the sign allocated thereto is calculated, followed by summation of all the products for the rectangular patterns and obtaining the absolute value of the resultant sum. Then, the process advances to step S203, wherein the signs for some of the rectangular patterns are changed and recalculation is conducted for the summation and obtaining the absolute value thereof in order to obtain a substantially zero or minimum value for the absolute value.

It is to be noted that since the signs for the mask A and the mask B are opposite, the equality or substantial equality of the pattern density between the mask A and the mask B can be obtained by making the absolute value of the total sum zero or at least the minimum thereof.

In the recalculation, it is substantially impossible to calculate for all the possible combinations of the signs within a practical time length. Thus, approximation is used for the recalculation to obtain the optimum distribution of the patterns.

In the present embodiment, the approximation calculation uses one or more of the three algorithms described hereinafter. In the first algorithm conducted in step S204, an initial solution is obtained from an arbitrary combination of the signs for the rectangular patterns, followed by calculation to obtain some solutions in the vicinity of the initial solution by changing the signs of some of the rectangular patterns of the initial solution. In this text, a set of solutions obtained in the vicinity of the initial solution is referred to as a "neighborhood". One of the solutions in the neighborhood which is considered an optimum solution is then selected as another initial solution for the next calculation. By iterating the recalculation based on the initial solution and the neighborhood, an optimum combination of the signs is to be found to determine the optimum distribution of the rectangular patterns.

It is to be noted that the approximation calculation using the first algorithm does not necessarily provide the optimum solution. In this case, the approximation uses a second algorithm in step S205, wherein a plurality of first initial solutions are prepared at random, followed by calculation of the neighborhoods from each of the first initial solutions by using the first algorithm and selection of an optimum one of the neighborhoods of the respective first initial solutions. By iterating the recalculation and selection of the neighborhood, the optimum solution for the distribution can be obtained. The second algorithm may be used without first using the first algorithm.

More effective selection of the optimum solution for the combination of signs is conducted based on the third algorithm in step S206, wherein a plurality of first initial solutions are prepared for the combination of signs at random, similarly to the second algorithm, followed by selecting two of the initial solutions, and forming a new combination based on the selected two of the initial solution. Starting from the selected initial solutions of the new combination, neighborhoods of the initial solutions are calculated using the first algorithm, followed by discarding the worst combination among the calculated combinations. From the rest of the combinations, new combinations are calculated to obtain respective neighborhoods and selected for finding an optimum combination of the signs. The rectangular patterns are distributed based on the thus calculated optimum combination.

Figure 7:
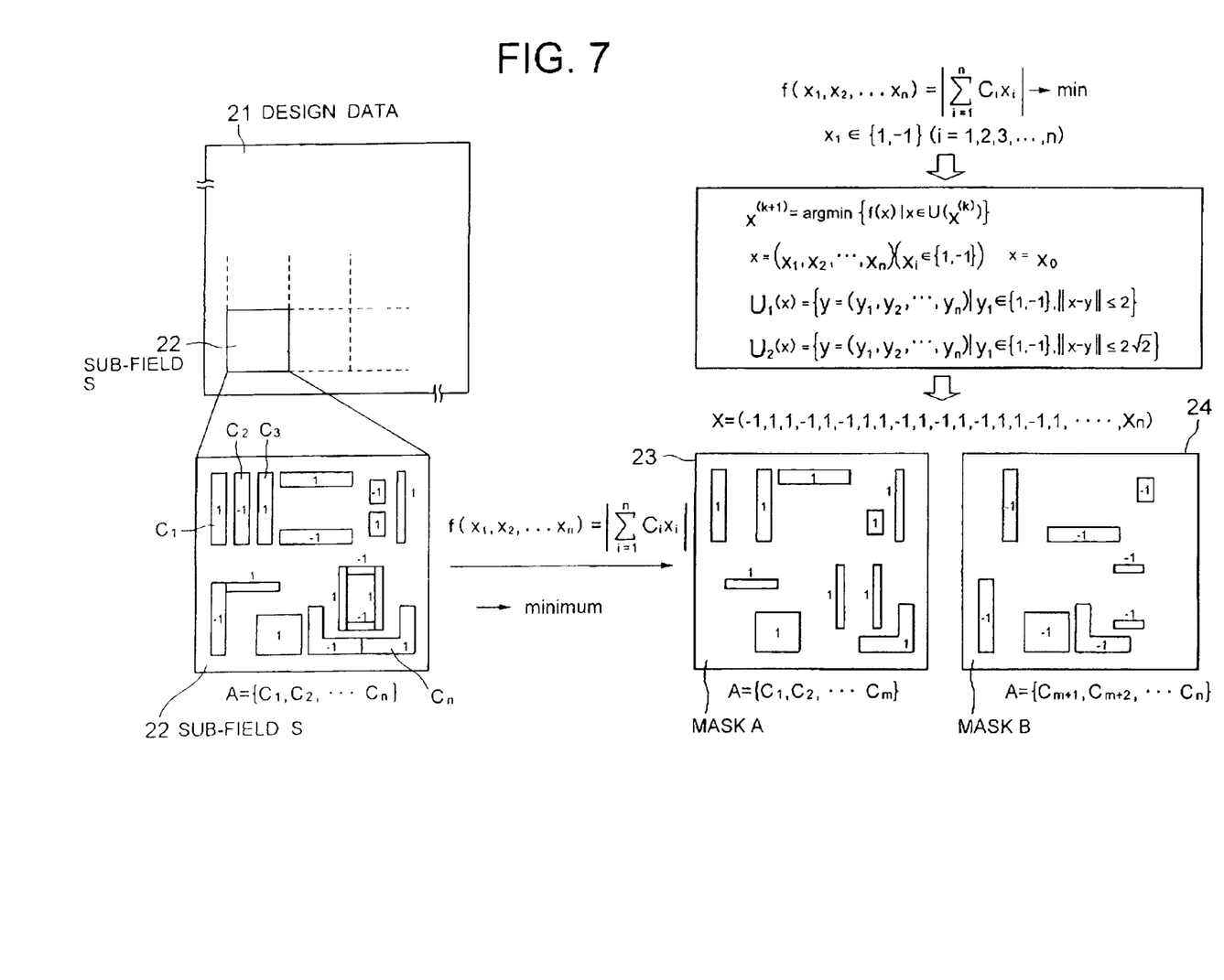
FIG. 7 is a conceptual diagram for illustrating an algorithm for the distribution of sub-field data.

Referring to FIG. 7, there is schematically shown an example of design data 21, sub-field data 22 and mask data 23, which are processed or obtained by processing of the method according to the present embodiment, as well as the algorithms used therein.

First, by using steps S101 to 103, the design data 21 is divided into a plurality of sub-field data 22, each of which has an area of 1 mm×1 mm size and can be projected at a time by an EPL system. One or more of the particular pattern data such as donut pattern data, which is not suitable as it is for forming a stencil opening, is extracted from the sub-field data 22. The extracted pattern data is divided into a plurality of rectangular pattern data. The pattern data including the thus obtained rectangular pattern data are to be distributed to the mask data A 23 or the mask data B 24 by using the algorithms as described above.

It is assumed that one of the sub-fields 22, e.g., sub-field S, has "n" patterns, each of which has an area of C1, C2, ..., or Cn, and that first to m-th patterns of the "n" patterns (m<n) are distributed to the mask data A 23, whereas the rest of the "n" patterns are distributed to the mask data B 24. This is shown by the following expression (1):

$$S\{C1, C2, \ldots, Cn\} \rightarrow A\{C1, C2, \ldots Cm\}, B\{Cm+1, Cm+2, \ldots, Cn\} \quad (1)$$

As described for step S201, a first sign +1 is assigned to each of the rectangular patterns distributed to the mask data A 23, whereas a second sign −1 is assigned to each of the rectangular patterns distributed to the mask data B 24. Thus, the sum of the products is calculated by multiplying the area of each pattern for the mask data A by +1 and the area of each pattern for the mask data B by −1 and subsequent summation of these products. For an equality or substantially equality between the pattern density of the mask A and the pattern density of the mask B is achieved by the following expression (2):

$$\left| \sum_{i=1}^{m} Ci - \sum_{i=m+1}^{n} Ci \right| \rightarrow \min. \quad (2)$$

The expression (2) may be also represented by the following relationship:

$$f(x_1, x_2, \cdots, x_n) = \left| \sum_{i=1}^{n} C_i x_i \right| \rightarrow \min. \quad (3)$$

$$x_i \in \{1, -1\} (i = 1, 2, \cdots, n)$$

By finding the combination of $x_i$'s satisfying the above relationship (3), the pattern data can be equally distributed to the mask A and the mask B. This is achieved by using the algorithms as described below.

First Algorithm

The combination of sings is herein represented by x, as follows:

$$x = (x1, x2, \ldots, xn).$$

For example, x may be expressed by $x=(1, -1, 1, 1, \ldots, -1)$.

For starting the calculation, an initial solution $x_0$ is assumed, and neighborhoods each including a plurality of solutions x are calculated therefrom. A neighborhood obtained from a solution x may be expressed by U(x). In this example, two neighborhoods U1(x) and U2(x) are calculated from the solution x, wherein U1(x) is a set of solutions including the solutions obtained by changing the sign of a single element of a solution x and the solution x itself, and U2(x) is a set of solutions including the solutions obtained by changing two elements of the solution x at a maximum and the solution x itself. Thus, these sets of solutions can be expressed by:

$$U1(x) = \{y = (y1, y2, \ldots, yn) | vi\{1, -1\} | |x - y| \leq 2\}$$
$$U2(x) = \{y = (y1, y2, \ldots, yn) | vi\{1, -1\} | |x - y| \leq 2\sqrt{2} \quad (4),$$

wherein y represents a solution (y1, y2, ..., yn) obtained by changing the sign of an element or two elements of solution x. The neighborhood U1(x) is obtained by changing the sign of a single element of x from −1 to +1 or from +1 to −1. In this configuration of neighborhood U1(x), the distance between two of the solutions in the neighborhood is two and thus the definition of neighborhood U1(x) is such that two of the solutions have a distance therebetween which is equal to or below two. Similarly, the definition of neighborhood U2(x) is such that two of the solutions have a distance therebetween which is equal to or below $2\sqrt{2}$.

By starting with the initial solution x0 and the neighborhoods U1(x) and U2(x), the following calculation is iterated for obtaining an optimum solution:

$$x^{(k+1)} = \operatorname{argmin}\{f(x) \mid X \, U(x^{(k)})\} \quad (5)$$
$$x = (x_1, x_2, \cdots, x_n)(x_i \in \{1, -1\}), x = x_0$$

In this notation, $x^{(k+1)}$ represents the (k+1)-th solution, "argmin" represents selection of a minimum, and $\{f(x)|x \in U(x^{(k)})\}$ means that the absolute value f(x) is calculated from a neighborhood of the solution $x^{(k)}$ which is obtained by the k-th calculation starting from the initial solution $x_0$.

The relationship (5) represents that the (k+1)-th solution $x^{(k+1)}$ is the solution x satisfying a minimum value for f(x) represented in the relationship (3) among the solutions in the neighborhood U(x) obtained by changing a single element of the k-th solution $x^{(k)}$.

In the first algorithm, the processing based on relationship (5) uses the neighborhood U1(x) which is obtained by changing the sign of a single element. However, there is a possibility, depending on the combination of sings in the initial solution, that x(k) is a locally optimum solution in the vicinity of the (k−1)-th solution, and results in the relationship x(k)=x(k+1). The locally optimum solution is different from the optimum solution itself, and does not provide any improvement of the solutions any more. In this case, iteration of recalculation using the neighborhood starting from U1(x) is improper, and the other neighborhood U2(x) is used, thereby preventing a larger time length from being consumed.

It is to be noted that the use of U2(x) may also cause a solution $x^{(k)}$ to reach a locally optimum solution. Accordingly, if the solution reaches a locally optimum solution wherein $x^{(k)} = x^{(k+1)}$, a most favorable solution in the neighborhood U2(x) excepting $x^{(k)}$ is selected as $x^{(k+1)}$ at a specified probability for updating the solution $x^{(k)}$. Since there is a possibility that the locally optimum solution is the optimum solution itself, the probability of updating is reduced in proportion to the reciprocal of the number of iteration times in the calculation. More specifically, for example, the probability assumes 0.1 if a hundred times of calculation provided a locally optimum solution, whereas the probability assumes 0.01 if a thousand times of calculation provided a locally optimum solution. By distributing the rectangular patterns to the mask A and the mask B based on the signs of the optimum solution thus reached, a substantial equality can be obtained in the pattern density of the EPL data between the mask A and the mask B.

Second Algorithm

It is difficult to avoid a locally optimum solution reached by the first algorithm, because the number of iteration times of calculation must be practical or finite. In addition, since it is not possible to forecast which initial solution provides the best result for obtaining the optimum solution, there is a possibility that the initial solution selected does not provide an optimum solution within a finite number of iteration times. For reducing the risk of such a possibility, a plurality of initial solutions are prepared at random beforehand, followed by approximating calculation for each of the initial solutions. For example, if ten initial solutions are prepared at the start of calculation, ten solutions are obtained by a specified number of iteration times for calculation. After selecting a best solution among the ten solutions reached, distribution of the pattern data is conducted to obtain the mask data A and B having a substantially equal pattern density. In this case, a more preferable optimum solution can be obtained within a smaller time length of calculation compared to the case of a single initial solution as used in the first algorithm.

Third Algorithm

Figure 8:
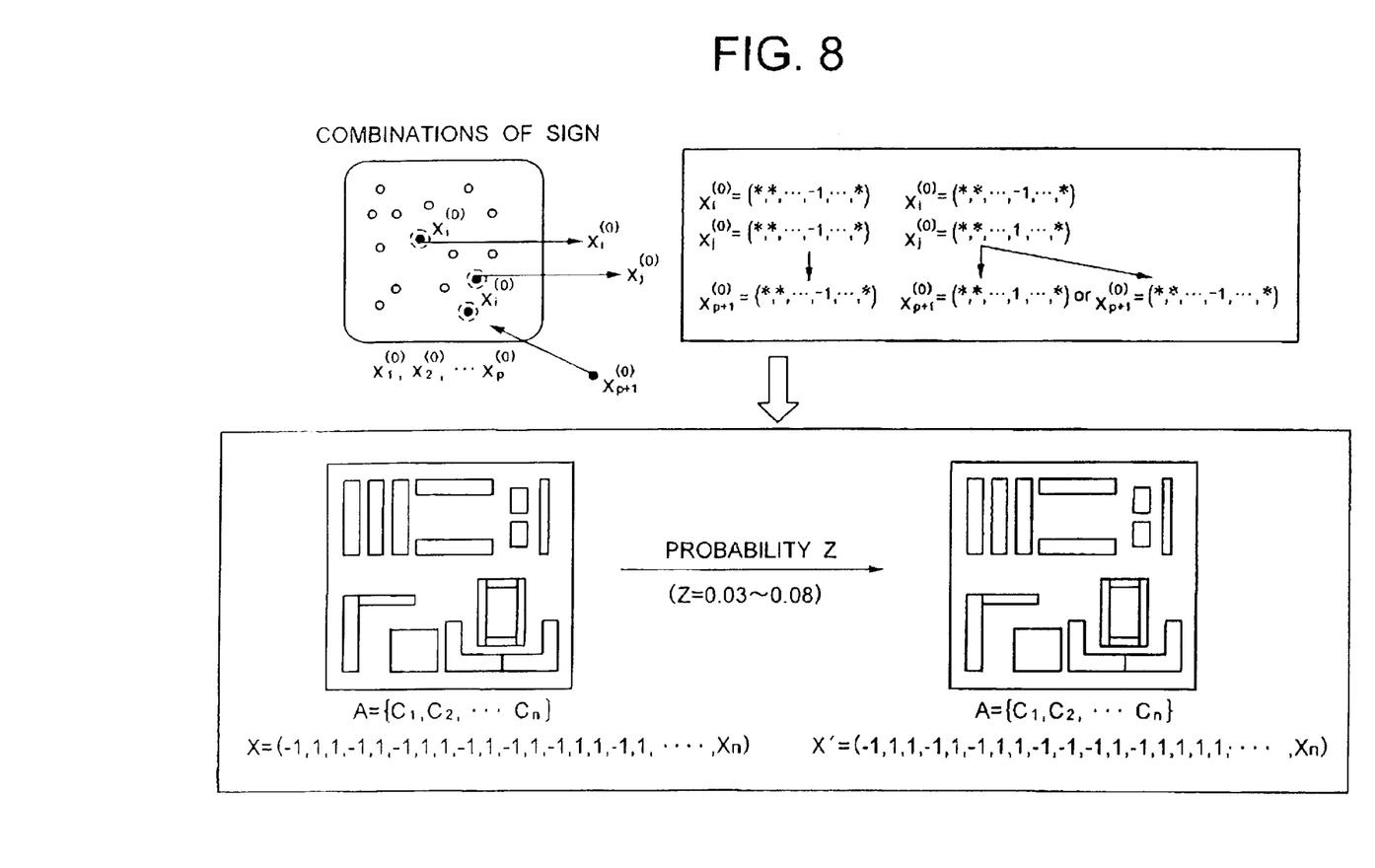
FIG. 8 is a conceptual diagram for illustrating another algorithm for the distribution of sub-field data.

A further preferable optimum solution may be obtained by the third algorithm, shown in FIG. 8. The process using the third algorithm includes the following steps.

(First Step)

A number (p) of initial solutions ($x_1^{(0)}, x_2^{(0)}, \ldots, x_p^{(0)}$) are prepared, wherein:

$$x_p^{(0)} = (\alpha, \beta, \gamma, \ldots).$$

By the notation in the latter expression, the subscript "p" represents the sequential number of the initial solution among the "p" solutions, not the element of the solution, and each of the elements $\alpha, \beta, \gamma$, etc. of $x_p^{(0)}$ represents either +1 or −1.

(Second Step)

Arbitrary two of the initial solutions are selected among the "p" initial solutions as original solutions, followed by calculation from the original solutions to obtain a new initial solution $x_{p+1}(0)$. In this step, as shown in the above right box of FIG. 8, each element of the (p+1)-th initial solution $x_{p+1}^{(0)}$ assumes the sign of both the corresponding elements of the original solutions $x_i^{(0)}$ and $x_j^{(0)}$ if both the corresponding elements have the same sign, whereas each element of the (p+1)-th initial solution $x_{p+1}^{(0)}$ assumes the sign of either element of both the corresponding elements at a probability of ½ if the corresponding elements of the original solutions $x_i^{(0)}$ and $x_j^{(0)}$ have opposite signs.

More specifically, in the example of FIG. 8, when the specified elements of the original initial solutions $x_i^{(0)}$ and $X_j^{(0)}$ have the same sign of −1, the corresponding element of the new initial solution $x_{p+1}^{(0)}$ assumes −1. On the other hand, when the corresponding elements of the original initial solutions $x_i^{(0)}$ and $x_j^{(0)}$ have opposite signs −1 and +1, the corresponding element of the new initial solution assumes either +1 or −1 each at a probability of ½.

(Third Step)

Before this third step, "p+1" initial solutions are generated. In this step, each element of these new initial solutions is changed at a probability constant of Z, wherein the probability constant Z preferably assumes a value between 0.03 and 0.08.

(Fourth Step)

Starting from the "p+1" initial solutions obtained in the third step, approximation calculation is conducted similarly to the second algorithm. Subsequently, the most undesirable initial solution among the resultant "p+1" initial solutions is discarded, and the remaining initial solutions are stored as temporary optimum solutions.

(Fifth Step)

A similar iterative calculation is conducted to the remaining "p" initial solutions, while discarding the most undesirable solution.

(Sixth Step)

The iterative processing is conducted for the temporary optimum solutions until a specified condition is obtained. The specified condition can be defined by an operator or user at a desired value and may be such that provides an equality of 99.9% between the mask A and the mask B. The most preferable one of the resultant temporary optimum solutions is finally selected as the final optimum solution. By distributing the patterns based on the signs specified by the final optimum solution, EPL masks A and B having a more preferable equality can be obtained.

It is to be noted that the pattern data may be distributed based on a specified condition by specifying the sign of the specific pattern data. For example, if it is desired beforehand to distribute a pattern data having a width of 0.1 $\mu$m to the mask A at any time, the sign $x_i$ of the pattern having an area of $C_i=a_i \times b_i$ is set at +1 if $a_i$ assumes 0.10. If such a specific condition is introduced during the calculation, both the resultant masks A and B have a substantially equal pattern density while satisfying the specific condition.

Since the above embodiments are described only for examples, the present invention is not limited to the above embodiments and various modifications or alterations can be easily made therefrom by those skilled in the art without departing from the scope of the present invention. For example, the signs to be allocated to the pattern data may be a pair of any numbers, characters or symbols so long as the pattern data are distributed based on the allocated numbers, characters or symbols.

What is claimed is:

1. A method for manufacturing a pair of complementary masks comprising the steps of extracting a plurality of pattern data from design data, distributing said pattern data to a pair of complementary mask data, and forming a pair of complementary masks based on said complementary mask data, said distributing step including the steps of;

allocating either a first or a second sign to each of said pattern data to obtain an initial combination of signs;

changing said sign of one or more element of initial combination to obtain a next combination, and calculating a sum data for said next combination by adding areas of said pattern data each having said first sign in said next combination while subtracting areas of said pattern data each having said second sign in said next combination;

iterating said changing of said sign and said calculating of a sum data for said next combination, to obtain an optimum combination of said first and second signs providing a minimum of said sum data; and assigning said pattern data having first signs to one of said complementary mask data, and said pattern having said second signs to the other of said complementary mask data.

2. The method as defined in claim 1, wherein said changing step generates a plurality of combinations of signs, each combination being formed by changing one of elements of said initial combination.

3. The method as defined in claim 1, wherein said changing step generates a plurality of combinations of signs, each combination being formed by changing a maximum of two of elements of said initial combination.

4. The method as defined in claim 1, wherein said allocating step generates a plurality of initial combinations of signs.

5. The method as defined in claim 4, wherein said changing step includes the steps of selecting two of said initial combinations of signs, generating a new combination based on said selected two of said initial combinations, and discarding one of a set of combinations including said initial combinations and said new combination.

6. The method as defined in claim 5, wherein an element of said new combination has a sign equal to the sign of corresponding elements of said selected two if said corresponding elements have the same sign, and that another element of said new combination has a first sign or a second sign at a probability of ½ if corresponding elements of said selected two has opposite signs.

* * * * *